US 6,700,147 B1

(12) United States Patent
Saigoh

(10) Patent No.: US 6,700,147 B1
(45) Date of Patent: Mar. 2, 2004

(54) SEMICONDUCTOR DEVICE AND METHOD OF MANUFACTURING THE SAME

(75) Inventor: Kaoru Saigoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 54 days.

(21) Appl. No.: 10/391,601

(22) Filed: Mar. 20, 2003

(30) Foreign Application Priority Data

Aug. 30, 2002 (JP) ......................................... 2002-255136

(51) Int. Cl.⁷ ................................................ H01G 7/06

(52) U.S. Cl. ........................... 257/295; 257/311; 438/3; 438/250

(58) Field of Search ...................... 257/295, 306–311; 438/3, 238–240, 381, 393–399, 205–256

(56) References Cited

U.S. PATENT DOCUMENTS 6,022,774 A  *  2/2000  Kawai et al. ................ 438/240

FOREIGN PATENT DOCUMENTS

JP            11-238855           8/1999

* cited by examiner

*Primary Examiner*—H. Jey Tsai
(74) *Attorney, Agent, or Firm*—Armstrong, Westerman & Hattori, LLP

(57) ABSTRACT

There is provided such a structure that a first insulating layer, a conductive pattern, a second insulating layer, a capacitor Q, a third insulating layer, and a lower electrode leading wiring are formed sequentially on a semiconductor substrate, and a lower electrode of the capacitor is connected to an upper surface of the conductive pattern, and the lower electrode leading wiring is also connected electrically to the conductive pattern from its upper side.

16 Claims, 16 Drawing Sheets

SEMICONDUCTOR DEVICE AND METHOD OF MANUFACTURING THE SAME

CROSS-REFERENCE TO RELATED APPLICATIONS

This application is based upon and claims priority of Japanese Patent Application No. 2002-255136, filed on Aug. 30, 2002, the contents being incorporated herein by reference.

BACKGROUND OF THE INVENTION

1. Field of the Invention

The present invention relates to a semiconductor device and a method of manufacturing the same and, more particularly, a semiconductor device having a capacitor and a method of manufacturing the same.

2. Description of the Prior Art

The nonvolatile memory element having the ferroelectric capacitor, which is called FeRAM or FRAM, is put on the market as the semiconductor memory. This nonvolatile memory element has features of a high-speed operation; low power consumption, and the large number of writing times, and its future development is anticipated.

As the capacitor formed in the memory cell area of such nonvolatile memory element, the planar type and the stacked type are known.

The planar capacitor has such a structure that the first wiring formed on the insulating layer, which covers the capacitor, is connected to the upper electrode via the first contact hole and the second wiring formed on the insulating film is connected to the lower electrode via the second contact hole.

The stacked capacitor has such a structure that the lower electrode is directly formed on the conductive plug formed in the insulating layer as the underlying layer of the capacitor. However, since the ferroelectric material and the lower electrode material constituting the capacitor are grown to take over the orientation of the underlying layer, the underlying layer must be made flat and formed of single material. Also, since the oxygen is indispensable to form the ferroelectric material and the lower electrode material is ready to transmit the oxygen, the conductive plug is oxidized to cause the defective contact readily.

Therefore, currently the planar capacitor is employed in most of FeRAMs that are available on the market.

The memory cell having the planar capacitor has a structure showing in FIG. 1 to FIG. 3, for example. FIG. 1 is a plan view showing a part of the memory cell area of FeRAM, and insulating layers except the element isolation insulating layer are omitted from the illustration. FIG. 2 is a sectional view taken along a I—I line in FIG. 1, and FIG. 3 is a sectional view taken along a II—II line in FIG. 1.

In FIG. 1, a well region 103 that is surrounded by an element isolation insulating layer 102 is formed on a silicon substrate 101. Then, MOS transistors 107a, 107b having a sectional structure shown in FIG. 2 are formed in the well region 103. Then, a planar capacitor 100 having a sectional structure shown in FIG. 2 and FIG. 3 is formed on the side of the well region 103.

In FIG. 2, two gate electrodes 105a, 105b are formed over the well region 103, which is surrounded by the element isolation insulating layer 102, of the silicon substrate 101 via a gate insulating layer 104. Also, impurity diffusion regions 106a, 106b, 106c having the LDD structure are formed in the silicon substrate 101 on both sides of the gate electrodes 105a, 105b. The first MOS transistor 107a consists of one gate, electrode 105a, the impurity diffusion regions 106a, 106b, etc. Also, the second MOS transistor 107b consists of the other gate electrode 105b, the impurity diffusion regions 106b, 106c, etc.

The element isolation insulating layer 102 and the MOS transistors 107a, 107b are covered with first and second insulating layers 108, 109. An upper surface of the second insulating layer 109 is planarized by the CMP (Chemical Mechanical Polishing) method, and the ferroelectric capacitor 100 is formed on the upper surface.

The ferroelectric capacitor 100 has a lower electrode 100a having a contact area, a ferroelectric layer 100b, and an upper electrode 100c. Then, a third insulating film 110 is formed on the capacitor 100 and the second insulating layer 109. The lower electrode 100a is formed by patterning a platinum layer. Also, the ferroelectric layer 100b is formed by patterning a PZT layer, for example. Then, the upper electrode 100c is formed by patterning an iridium oxide layer, for example.

In the first to third insulating layers 108 to 110, a first contact hole 110b is formed on the impurity diffusion region 106 between two gate electrodes 104a, 104b and also second and third contact holes 110a, 100c are formed on the impurity diffusion regions 106a, 106c located near both ends of the well region 103 respectively. Also, as shown in FIG. 3, a fourth contact hole 110d is formed on the contact area of the lower electrode 100a.

First to fourth conductive plugs 111a to 111d made of an adhesive layer and a tungsten layer respectively are formed in the first to fourth contact holes 110a to 110d. Also, a fifth contact hole 112 is formed on the upper electrode 100c of the capacitor 100.

A first wiring 120a, which is connected to an upper surface of the first conductive plug 111a and is connected to the upper electrode 100c via the fifth contact hole 112, is formed on the third insulating layer 110. Also, a second wiring 120c, which is connected to an upper surface of the third conductive plug 111c and is connected to another upper electrode 100c via another fifth contact hole 112, is formed on the third insulating layer 110. Also, a conductive pad 120b is formed on the second conductive plug 111b and the neighboring third insulating layer 110.

In addition, as shown in FIG. 3, a third wiring 120d, which is connected to an upper surface of the contact area of the lower electrode 100a via the fourth conductive plug 111d, is formed on the third insulating layer 110.

A fourth insulating layer 121 is formed on the first, second, and third wirings 120a, 120c, 120d, the conductive pad 120b, and the third insulating layer 110. A sixth contact hole 121a is formed in the fourth insulating layer 121 on the conductive pad 120b. A bit-line conductive plug 122 is formed in the sixth contact hole 121a. Also, a bit line 123 that is connected to the bit-line conductive plug 122 is formed on the fourth insulating layer 121.

By the way, in the above planar capacitor 100, as shown in FIG. 3, the contact area of the lower electrode 100a of the capacitor 100 is exposed from the ferroelectric layer 100b before the third insulating layer 110 is formed.

If the reducing gas is employed as the reaction gas when the fourth conductive plug 111d is to be formed on the lower electrode 100a, such reaction gas is supplied to the lower electrode 100a of the capacitor 100 via the contact hole 110d and then is moved along the lower electrode 100a to reduce the ferroelectric layer 100b. Therefore, the deterioration of the characteristics of the capacitor 100 that is formed in the area that is located in vicinity of the fourth conductive plug 111d is caused. Also, since the lower electrode 100a made of platinum is exposed from the ferroelectric layer 100b in the contact area to the fourth conductive plug 111d, the characteristics of the capacitor 100 located near the contact area are ready to deteriorate because of the catalytic action of the platinum.

SUMMARY OF THE INVENTION

It is an object of the present invention to provide a semiconductor device capable of suppressing deterioration of a capacitor in an area located in vicinity of a contact portion between a lower electrode and a wiring, and a method of manufacturing the same.

According to one aspect of the present invention, there is provided a semiconductor device comprising: a first insulating layer formed on a semiconductor substrate; a conductive pattern formed on the first insulating layer; a second insulating layer for covering the conductive pattern; a first hole formed in the second insulating layer on the conductive pattern; a lower electrode of a capacitor formed on the second insulating layer and having a contact area, a lower surface of which is connected electrically to the conductive pattern via the first hole; a dielectric layer of the capacitor formed on the lower electrode; an upper electrode of the capacitor formed on the dielectric layer in regions except the contact area; a third insulating layer formed on the upper electrode and the second insulating layer; a second hole formed in the third insulating layer and the second insulating layer on the conductive pattern at an interval from the first hole; and a lower electrode leading wiring formed on the third insulating layer to be connected electrically to the conductive pattern via the second hole.

According to another aspect of the present invention, there, is provided a manufacturing method of a semiconductor device comprising the steps of: forming a first insulating layer on a semiconductor substrate; forming a conductive layer on the first insulating layer; forming a conductive pattern by patterning the conductive layer; forming a second insulating layer on the conductive pattern and the first insulating layer; forming a first hole in the second insulating layer on the conductive pattern; forming a lower electrode conductive layer in the first hole and on the second insulating layer; forming a dielectric layer on the lower electrode conductive layer; forming an upper electrode conductive layer on the dielectric layer; forming a capacitor upper electrode in a region that is away from the first hole by patterning the upper electrode conductive layer; forming a capacitor dielectric layer under at least the upper electrode by patterning the dielectric layer; forming a capacitor lower electrode, which is connected electrically to the conductive pattern, in areas containing a range that extends from a lower surface of the capacitor dielectric layer to an inside of the first hole by patterning the lower electrode conductive layer; forming a third insulating layer on the capacitor lower electrode, the capacitor dielectric layer, and the capacitor upper electrode, and the second insulating layer; forming a second hole in the third insulating layer and the second insulating layer on the conductive pattern at an interval from the first hole; and forming a lower electrode leading wiring, which is connected electrically to the conductive pattern via the second hole, on the third insulating layer.

According to the present invention, the first insulating layer, the conductive pattern, the second insulating layer, the capacitors, the third insulating layer, and the lower electrode leading wiring are formed sequentially over the semiconductor substrate, then the lower electrode of the capacitor is connected to the upper surface of the conductive pattern, and then the lower electrode leading wiring is also connected electrically to the conductive pattern from its upper side.

Therefore, in order to extend electrically the lower electrode onto the third insulating layer, there is no need that the lower electrode leading wiring should be connected to the upper surface of the lower electrode. Hence, the step of forming the contact hole on the lower electrode is omitted, and thus the lower electrode is never exposed to the reducing gas via the contact hole. As a result, the reducing gas is prevented from being supplied to the ferroelectric layer along the lower electrode, and thus the degradation of the capacitor is prevented.

In addition, the overall upper surface of the lower electrode can be covered with the dielectric layer.

Therefore, the deterioration of the ferroelectric layer caused due to the catalytic action of platinum constituting the lower electrode can be suppressed in the steps executed after the capacitor is formed, and thus the characteristics of the capacitor can be maintained satisfactorily.

DETAILED DESCRIPTION OF THE PREFERRED EMBODIMENT

An embodiment of the present invention will be explained with reference to the drawings hereinafter.

FIGS. 4A to 4I are sectional views showing steps of manufacturing a memory cell of a semiconductor device according to an embodiment of the present invention along a bit-line extending direction. Also, FIGS. 5A to 5I are sectional views showing steps of forming a memory cell of the semiconductor device according to the embodiment of the present invention along a word-line extending direction. FIG. 6 is a plan view showing an arrangement of capacitors and transistors in a memory cell region.

Figure 1:
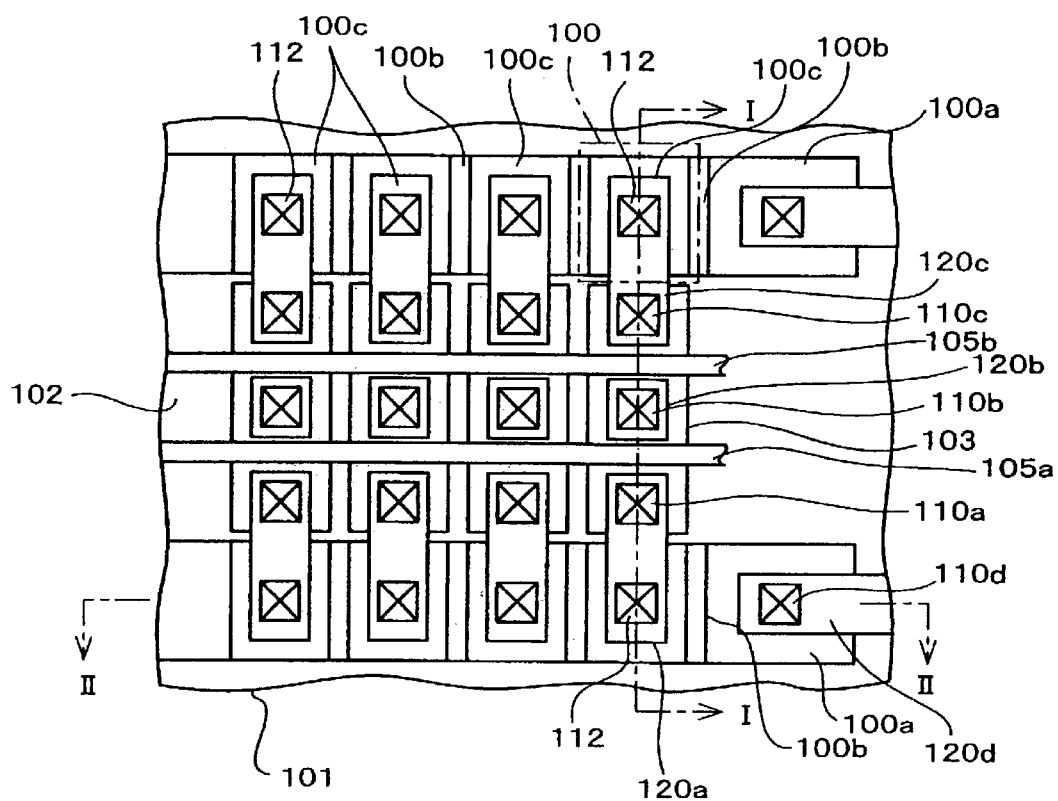
FIG. 1 is a plan view showing the device in the prior art.
Figure 2:
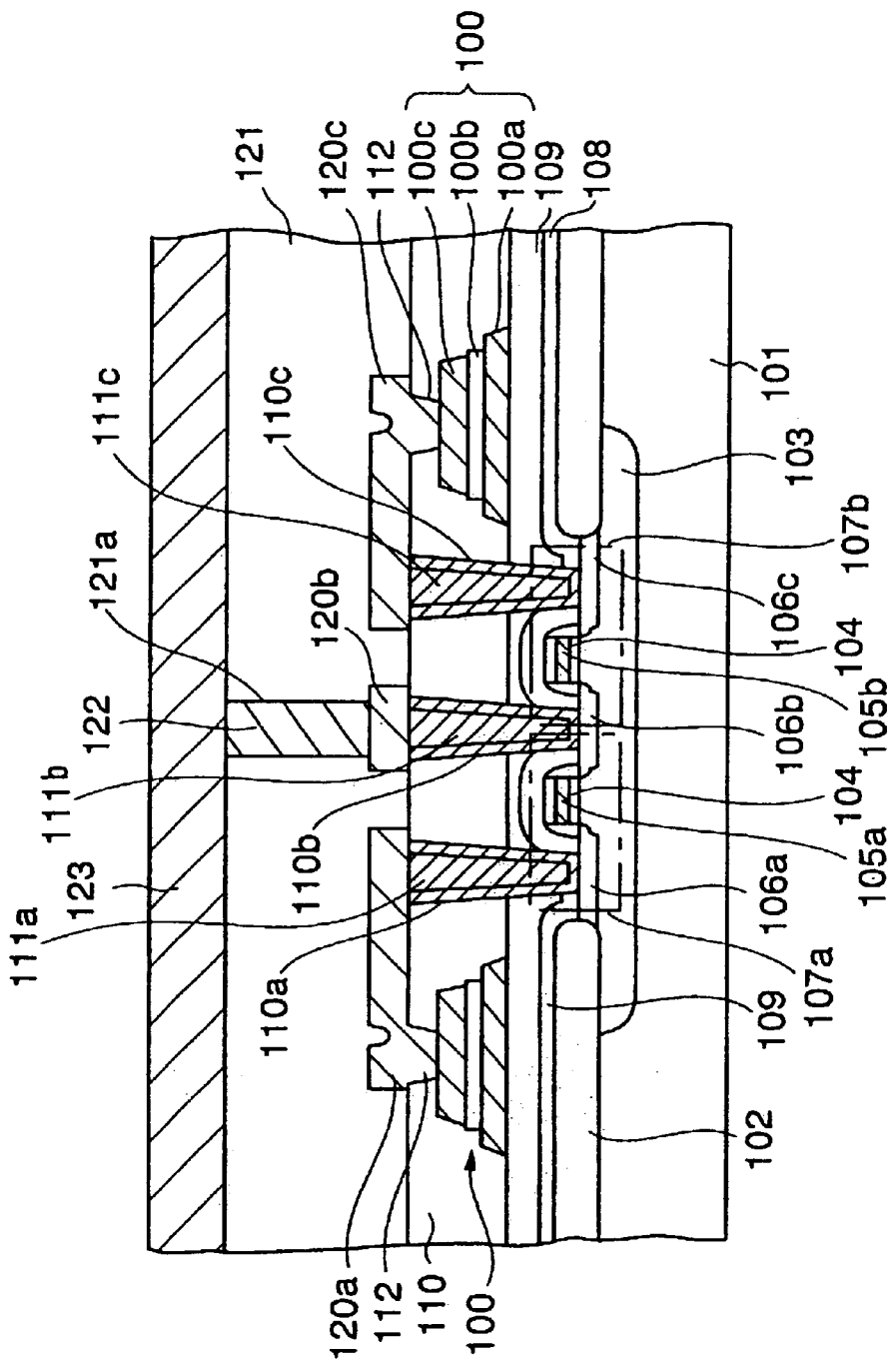
FIG. 2 is a first sectional view showing the device in the prior art.
Figure 3:
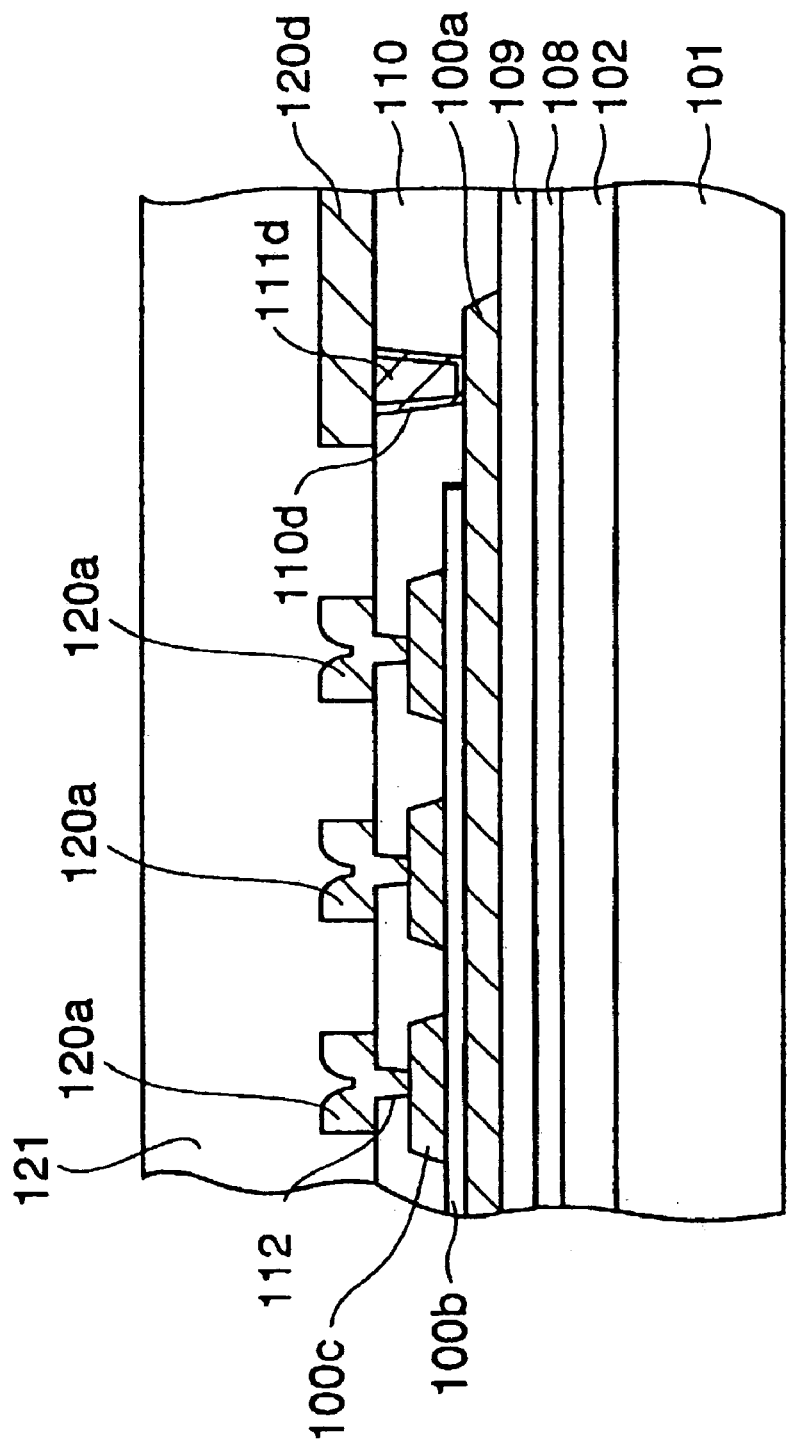
FIG. 3 is a second sectional view showing the device in the prior art.
Figure 4A:
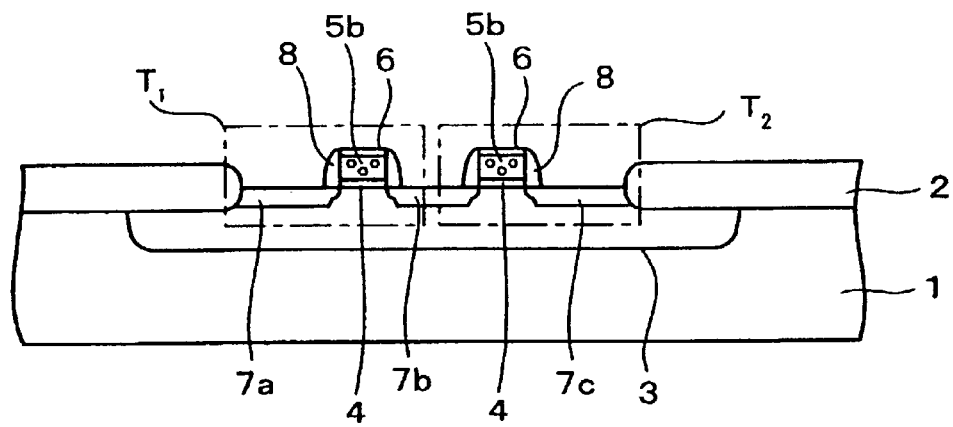
FIGS. 4A to 4I are sectional views showing a semiconductor device according to an embodiment of the present invention along a first direction.
Figure 5A:
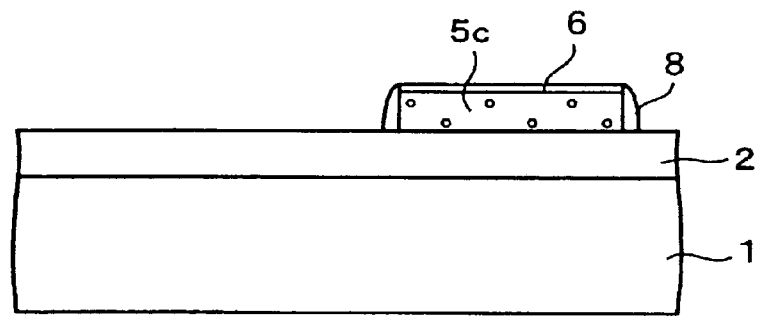
FIGS. 5A to 5I are sectional views showing the semiconductor device according to the embodiment of the present invention along a second direction.
Figure 6:
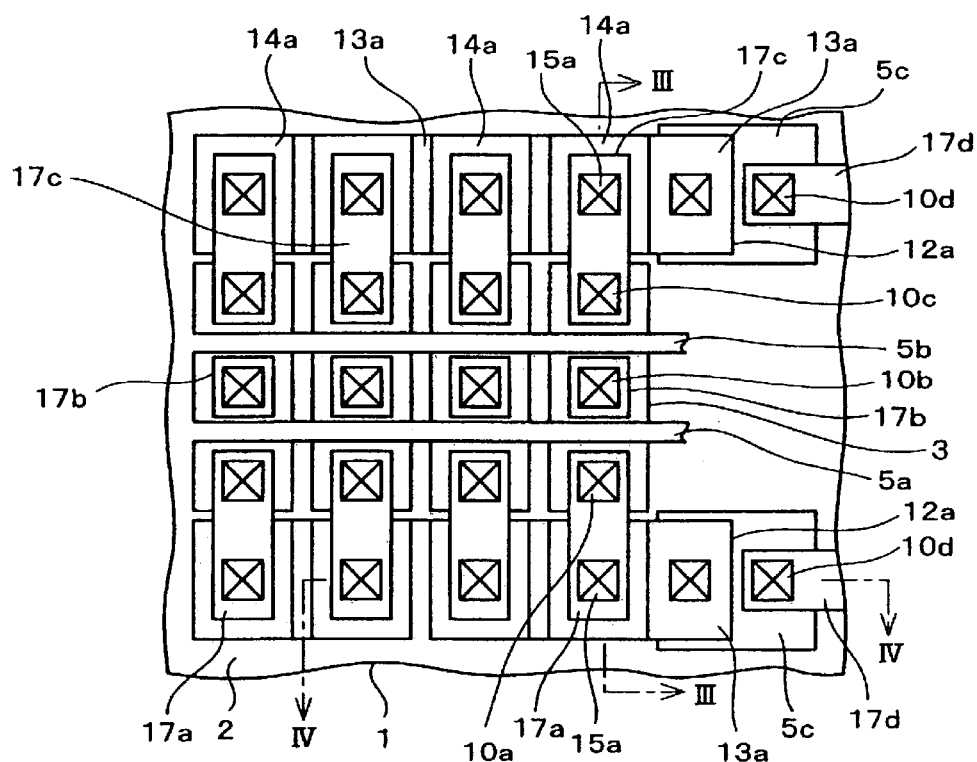
FIG. 6 is a plan view showing the semiconductor device according to the embodiment of the present invention.

First, steps required until a sectional structure shown in FIG. 4A and FIG. 5A is formed will be explained hereunder.

An element isolation insulating layer 2 is formed on a surface of an n-type or p-type silicon (semiconductor) substrate 1 by the LOCOS (Local Oxidation of Silicon) method. As the element isolation insulating layer 2, STI (Shallow Trench Isolation) may be employed.

After such element isolation insulating layer 2 is formed, a p-well 3 is formed in a predetermined active region (transistor forming region) in a memory cell region of the silicon substrate 1.

Then, a silicon oxide layer is formed by thermally oxidizing a surface of the active region of the silicon substrate 1, and is used as a gate insulating film 4.

Then, a conductive layer made of polysilicon, for example, is formed on the overall upper surface of the silicon substrate 1. Then, the conductive layer is patterned by the photolithography method. Thus, gate electrodes 5a, 5b made of the conductive layer are formed, as shown in FIG. 4A, and at the same time an island-like conductive pad (conductive pattern) 5c, a part of which overlaps with an end portion of a capacitor lower electrode region, is formed on the element isolation insulating layer 2, as shown in FIG. 5A. The conductive pad 5c has a width of about 2 $\mu$m and a length of about 3.5 $\mu$m. In this case, the impurity is introduced into the polysilicon during the growth of the polysilicon or after the growth of the polysilicon.

As the conductive layer constituting the gate electrodes 5a, 5b and the conductive pad 5c, a single layer structure such as impurity-containing amorphous silicon, tungsten silicide, or the like, or a multi-layered structure such as silicide/silicon, or the like may be employed in addition to the polysilicon layer. In this case, a resistance element (not shown) may be formed on the element isolation insulating layer 2 by patterning the conductive layer.

In this case, a protection insulating layer 6 made of silicon nitride, or the like is formed on the conductive layer and is patterned together with the conductive layer.

Two gate electrodes 5a, 5b are arranged in almost parallel on one p-well 3 in the memory cell area. These gate electrodes 5a, 5b are extended onto the element isolation insulating layer 2 to constitute a part of the word line.

Then, n-type impurity diffusion regions 7a to 7c serving as the source/drain of the n-channel MOS transistor are formed by ion-implanting the n-type impurity into the p-well 3 on both sides of the gate electrodes 5a, 5b. Then, an insulating layer is formed on the overall surface of the silicon substrate 1, and then sidewall insulating layers 8 are left on both side portions of the gate electrodes 5a, 5b by etching back the insulating layer. The insulating layer is a silicon oxide ($SiO_2$) layer that is formed by the CVD method, for example.

Then, the n-type impurity diffusion regions 7a to 7c are formed into the LDD structure by ion-implanting the n-type impurity into the p-well 3 once again while the gate electrodes 5a, 5b and the sidewall insulating layers 8 as a mask. In this case, in one p-well 3, the n-type impurity diffusion region 7b that is put between two gate electrodes 5a, 5b is connected electrically to the bit line described later, and the n-type impurity diffusion regions 7a, 7c that are formed near both ends of the p-well 3 are connected electrically to the capacitor upper electrode, described later, respectively.

As described above, two MOS transistor $T_1$, $T_2$ are constructed by the gate electrodes 5a, 5b, the n-type impurity diffusion regions 7a to 7c, etc. in the p-well 3 of the memory cell area.

Figure 4B:
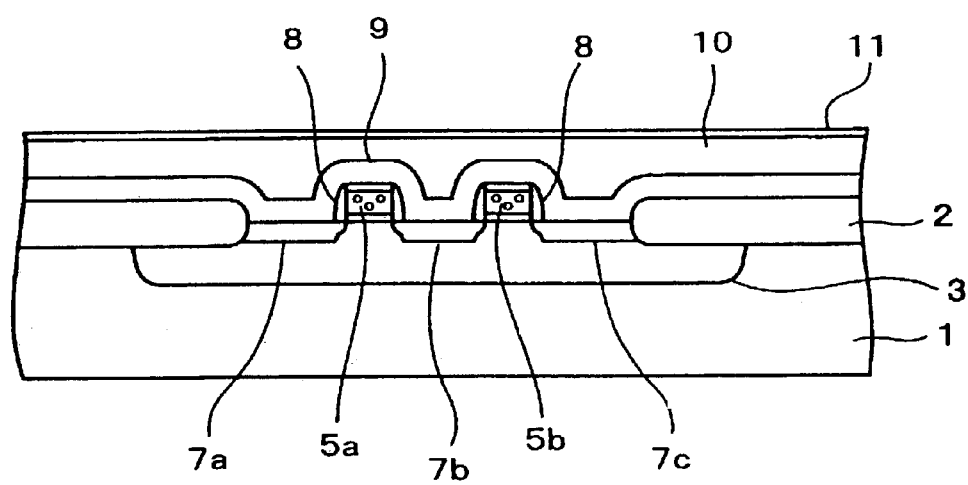
Figure 5B:
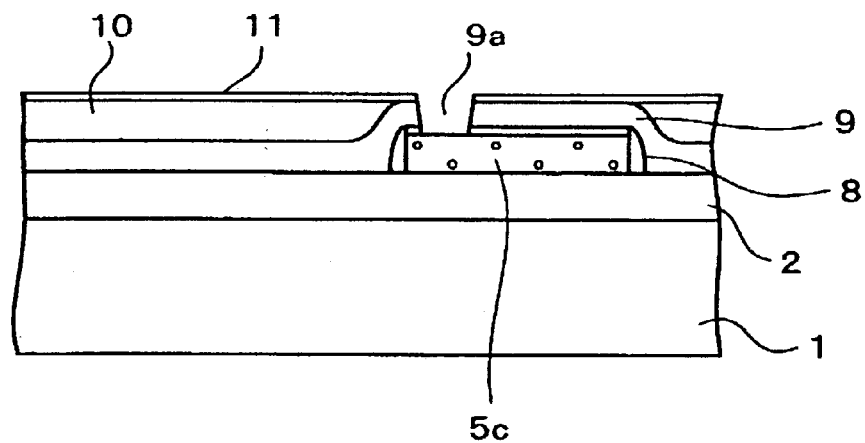

Next, steps required until a sectional structure shown in FIG. 4B and FIG. 5B is formed will be explained hereunder.

First, a silicon oxide nitride (SiON) layer of about 200 nm thickness is formed as a cover insulating layer 9 on the MOS transistor $T_1$, $T_2$ and the element isolation insulating layer 2 by the plasma CVD method. Then, a silicon dioxide ($SiO_2$) layer of about 1.0 $\mu$m thickness is grown as a first interlayer insulating layer 10 on the cover insulating layer 9 by the plasma CVD method using the TEOS gas. Then, an upper surface of the first interlayer insulating layer 10 is polished by the CMP (Chemical Mechanical Polishing) method to planarize.

Then, a silicon nitride layer and a silicon oxide layer are formed sequentially as an underlying insulating layer 11 on the first interlayer insulating layer 10 by the CVD method.

Then, the first interlayer insulating layer 10, the underlying insulating layer 11, and the protection insulating layer 6 are patterned by the photolithography method. Thus, a lower-electrode contact hole 9a having a size of 1.8 $\mu$m×1.8 $\mu$m is formed on the conductive pad 5c, which is formed on the element isolation insulating layer 2, in a region that is located near the MOS transistor $T_1$, $T_2$. Accordingly, a part of the conductive pad 5c is exposed.

Figure 4C:
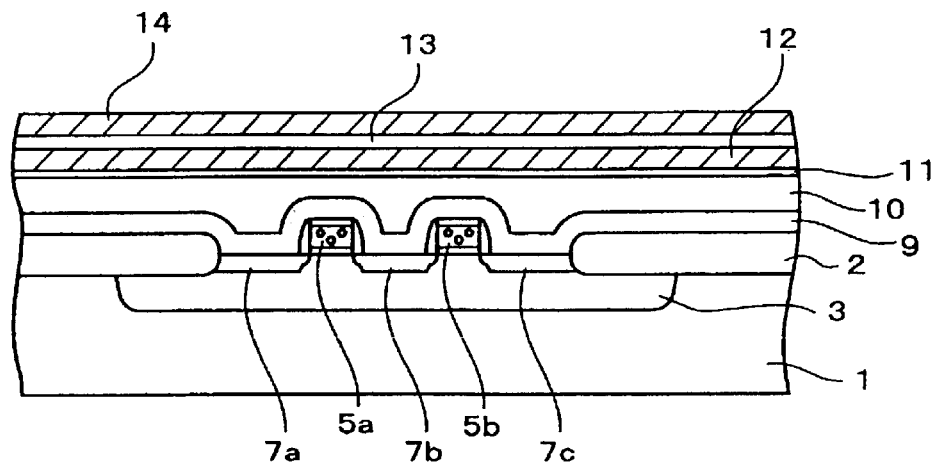
Figure 5C:
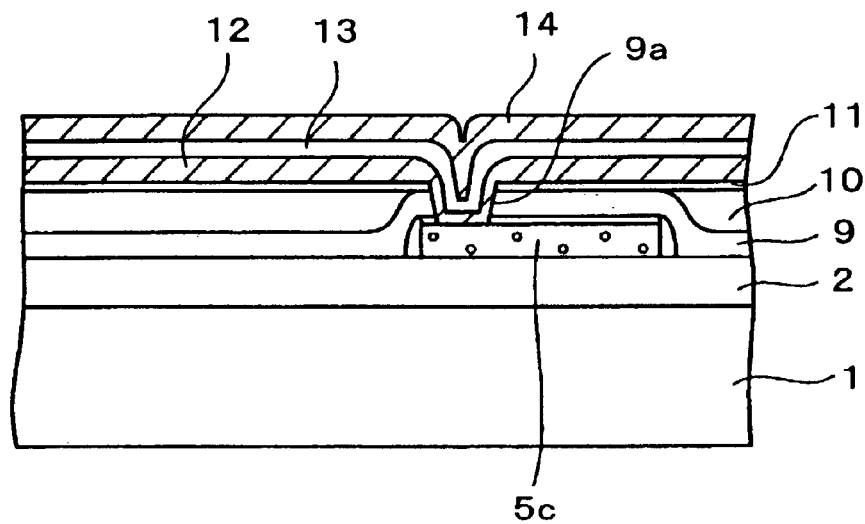

Next, steps required until a structure shown in FIG. 4C and FIG. 5C is formed will be explained hereunder.

First, a platinum (Pt) layer of 100 to 300 nm thickness is formed in the lower-electrode contact hole 9a and on the underlying insulating layer 11 by the DC sputter method, and this layer is used as a first conductive layer 12. As the first conductive layer 12, a layer made of at least one of noble metal and noble metal oxide is employed. In order to improve the adhesion between the first conductive layer 12 and the first interlayer insulating layer 10, a titanium layer of 10 to 30 nm thickness may be formed between these layers.

Then, a PZT ($Pb(Zr_{1-x}Ti_x)O_3$) layer of 100 to 300 nm thickness is formed on the first conductive layer 12 by the sputtering method, and then this layer is used as a ferroelectric layer 13.

Then, the silicon substrate 1 is put into the oxygen atmosphere, and then the PZT layer constituting the ferroelectric layer 13 is crystallized by executing RTA (Rapid Thermal Annealing) at 725° C. for 20 second at the programming rate of 125° C./sec, for example.

As the material of the ferroelectric layer 13, PZT material such as PLZT, PLCSZT, etc., Bi-layered structure compound material such as $SrBi_2Ta_2O_9$, $Bi_4Ti_2O_{12}$, etc., and other oxide dielectric materials may be formed in addition to the above. As the method of forming the ferroelectric layer 13, there are the spin-on method, the sol-gel method, the MOD (Metal Organic Deposition) method, and the MOCVD method in addition to the sputter method.

In addition, an iridium oxide ($IrO_x$) layer of 150 to 250 nm thickness is formed as a second conductive layer 14 on the ferroelectric layer 13 by the sputtering method. In this case, as the second conductive layer 14, a platinum layer or a strontium ruthenate (SRO) layer may be formed by the sputter method.

Figure 4D:
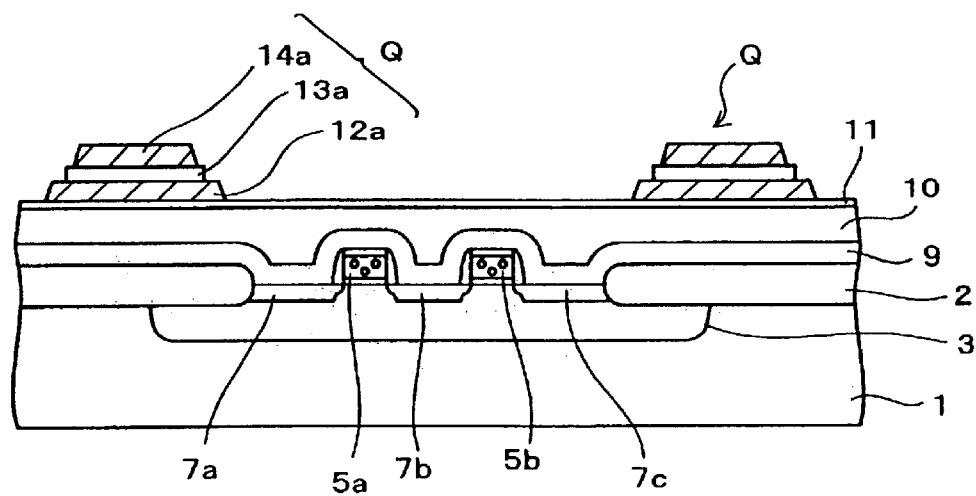
Figure 5D:
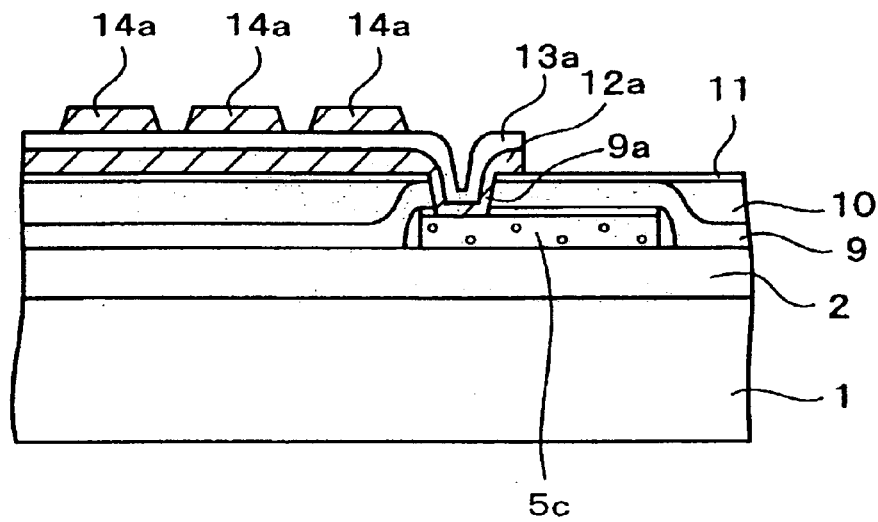

Then, as shown in FIG. 4D and FIG. 5D, a plurality of upper electrodes 14a are formed at an interval over the element isolation insulating layer 2 along the side of each word line by patterning the second conductive layer 14.

Then, a stripe-like capacitor ferroelectric layer 13a and a lower electrode (plate line) 12a, which pass through under a plurality of upper electrodes 14a that are arranged along the side of the word line, are formed by patterning the ferroelectric layer 13 and the first conductive layer 12. The lower electrode 12a is connected to the conductive pad 5c through the lower-electrode contact hole 9a. An upper surface of the lower electrode 12a is covered with the ferroelectric layer 13a up to a region that reaches the end portion. A width of the lower electrode 12a is set to about 2 $\mu$m.

One capacitor Q consists of the upper electrode 14a, the underlying ferroelectric layer 13a, and the lower electrode 12a.

Then, the ferroelectric layer 13a is annealed at the temperature of 650° C. for 60 minute in the oxygen atmosphere. This annealing is executed to recover the quality of the ferroelectric layer 13 from the damage that is caused by the sputtering and the etching.

In this case, after the upper electrode 14a of the capacitor Q is formed, an $Al_2O_3$ layer of 50 nm thickness ay be formed as an encap layer on the upper electrode 14a and the ferroelectric layer 13a by the sputtering method. The encap layer is formed to protect the ferroelectric layer 13a, which is readily reduced, from the hydrogen. As the encap layer, a PZT layer, a PLZT layer, or a titanium oxide layer may be formed.

Figure 4E:
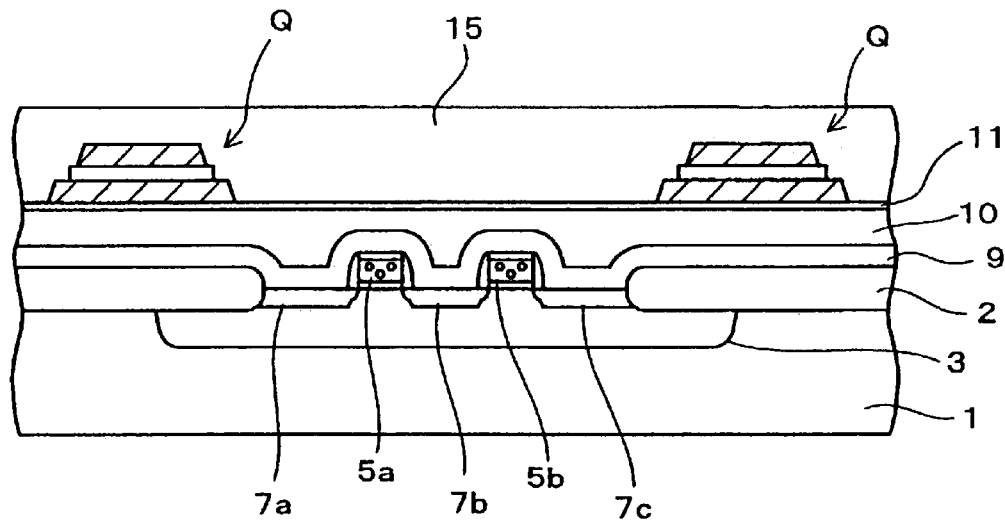
Figure 5E:
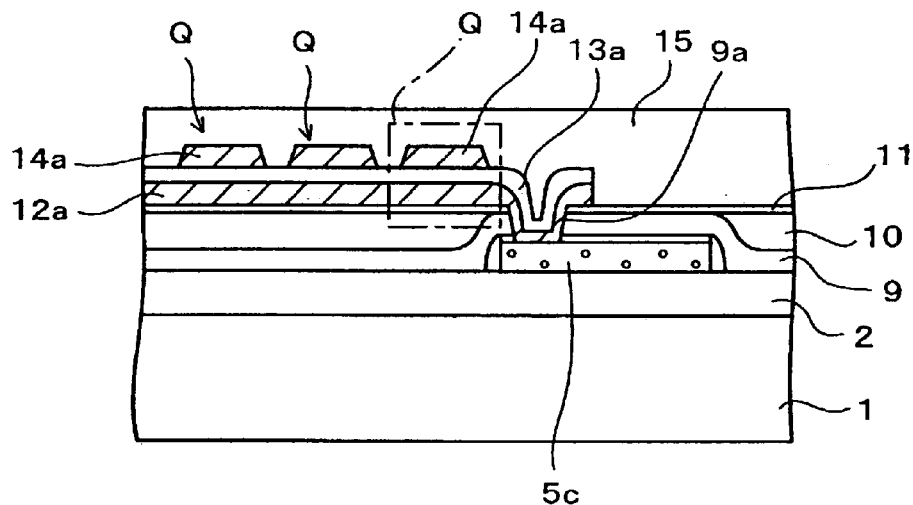

Then, as shown in FIG. 4E and FIG. 5E, an $SiO_2$ layer of 1200 nm thickness is formed as a second interlayer insulating layer 15 on the capacitor Q and the underlying insulating layer 11 by the CVD method. Then, a surface of the second interlayer insulating layer 15 is planarized by the CMP method. The growth of the second interlayer insulating layer 15 may be executed by using either silane ($SiH_4$) or TEOS as the reaction gas. The planarization of the upper surface of the second interlayer insulating layer 15 is executed until a thickness of about 200 nm from the upper surface of the [up]per electrode 14a of the capacitor Q is obtained.

Figure 4F:
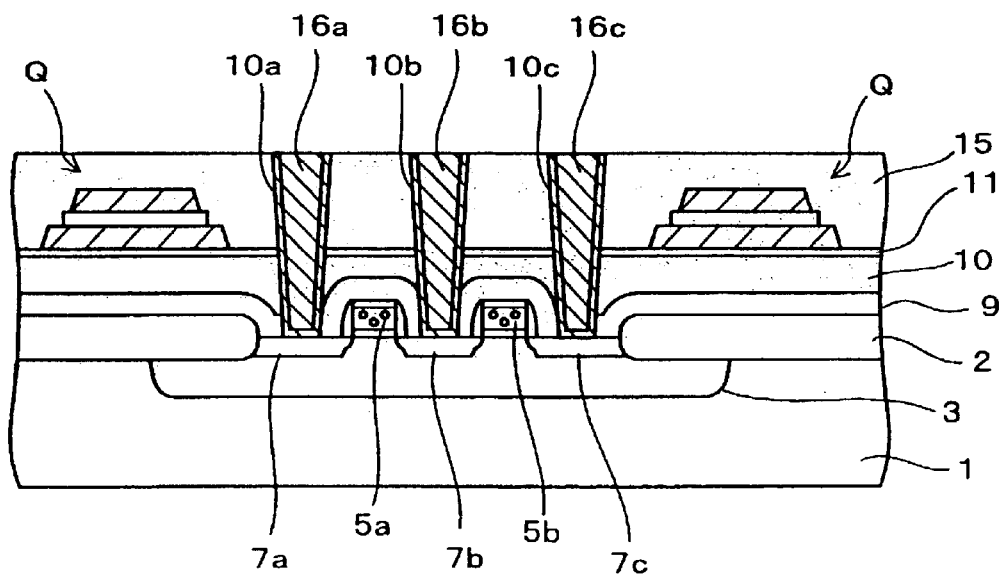
Figure 5F:
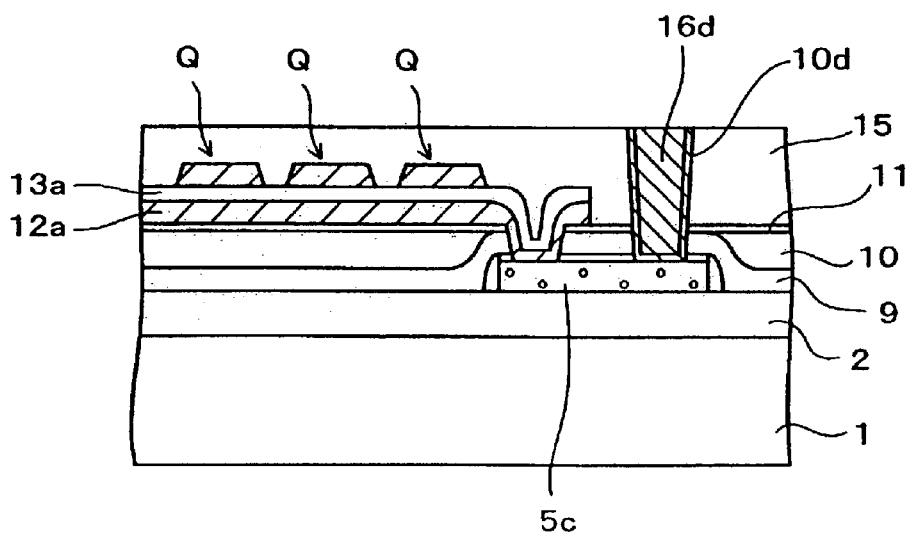

Next, steps required until a structure shown in FIG. 4F and FIG. 5F is formed will be explained hereunder.

First, the first and second interlayer insulating layers 10, 15, the underlying insulating layer 11, and the cover insulating layer 9 are patterned. Thus, first to third contact holes 100a to 10c are formed on the first to third n-type impurity diffusion layers 6a to 6c respectively and at the same time a fourth contact hole 10d having a size of about 0.6 μm×0.6 μm is formed on the conductive pad 5c in an area that does not overlap with the lower electrode 12a. As the etching gas for the first and second interlayer insulating layers 10, 15 and the cover insulating layer 9, the CF gas. e.g., a mixed gas that is obtained by adding Ar into $CF_4$ is employed.

Then, a titanium (Ti) layer of 20 nm thickness and a titanium nitride (TiN) layer of 50 nm thickness are formed on an upper surface of the second interlayer insulating layer 15 and inner surfaces of the wiring contact holes 10a to 10d by the sputtering method, and these layers are used as a conductive adhesive layer. Then, a tungsten layer is formed on the adhesive layer by the CVD method using a mixed gas consisting of tungsten hexafluoride ($WF_6$), argon, and hydrogen. Insides of the wiring contact holes 10a to 10d are buried perfectly by this tungsten.

Then, the tungsten layer and the adhesive layer on the second interlayer insulating layer 15 are removed by the CMP method and are left only in the wiring contact holes 10a to 10d. Thus, the tungsten layer and the adhesive layer in the wiring contact holes 10a to 10d are used as first to fourth conductive plugs 16a to 16d respectively.

In this case, in one p-well 3 in the memory cell area, the second conductive plug 16b formed on the n-type impurity diffusion region 7b between two gate electrodes 5a, 5b is connected electrically to the bit line described later, and the first and third conductive plugs 16a, 16c formed on both sides thereof are connected electrically to separate capacitor upper electrodes 14a via wirings described later. Also, the fourth conductive plug 16d that is formed on the conductive pad 5c is connected to a wiring described later.

Then, the second interlayer insulating layer 15 is annealed at the temperature of 390° C. in the vacuum chamber to dehydrate.

Figure 4G:
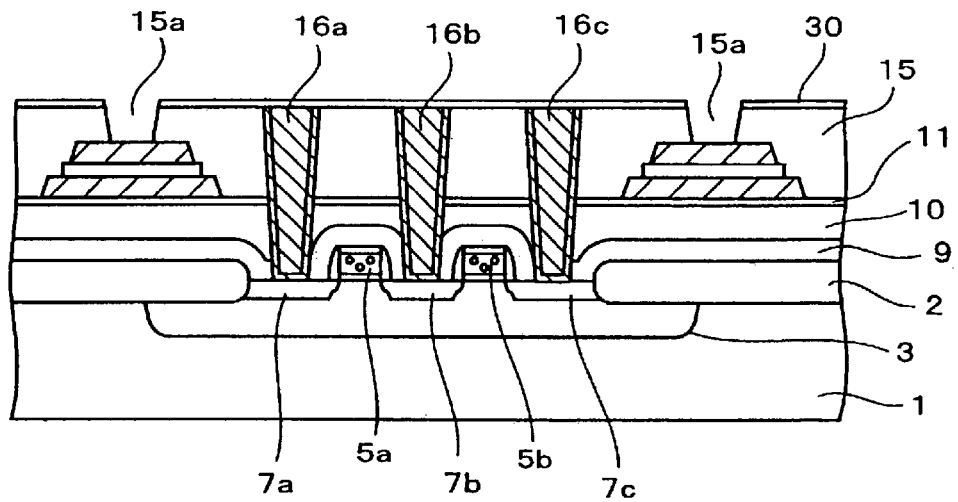
Figure 5G:
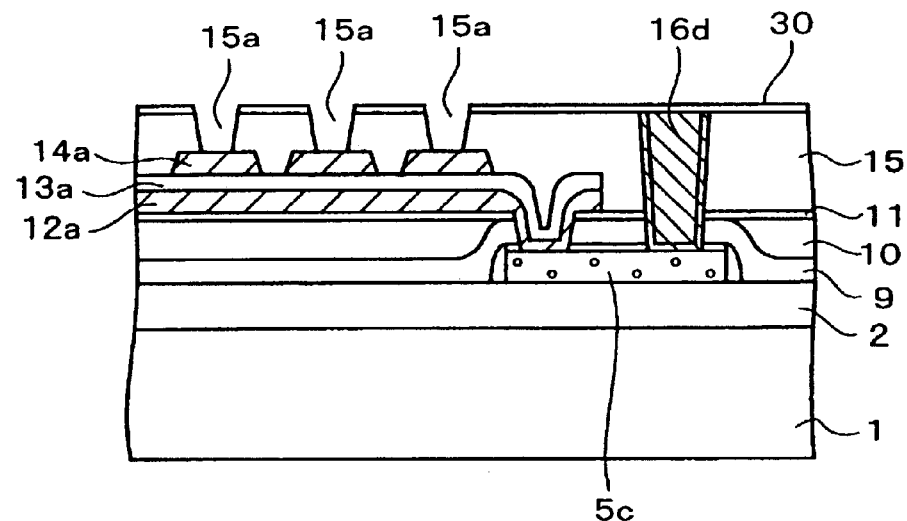

Next, steps required until a structure shown in FIG. 4G and FIG. 5G is formed will be explained hereunder.

First, a SiON layer of 100 nm thickness, for example, is formed as an oxidation preventing layer 30 on the second interlayer insulating layer 15 and the first to fourth conductive plugs 16a to 16d by the plasma CVD method. This SiON layer is formed by using a mixed gas consisting of silane ($SiH_4$) and $N_2O$.

Then, photoresist (not shown) is coated on the oxidation preventing layer 30, and windows are formed on the upper electrodes 14a of the capacitors Q by exposing/developing the photoresist. Then, the oxidation preventing layer 30 and the second interlayer insulating layer 15 are etched by using the photoresist as a mask. Thus, upper electrode contact holes 15a are formed on the upper electrodes 14a of the capacitors Q respectively.

Then, the photoresist is removed. Then, the dielectric layer 13a of the capacitor Q is annealed at 550° C. for 60 minute in the oxygen atmosphere to improve the quality of the dielectric layer 13a. In this case, the first to fourth conductive plugs 16a to 16d are prevented by the oxidation preventing layer 30 from being oxidized. Then, the oxidation preventing layer 30 is removed by the dry etching using the CF gas.

Figure 4H:
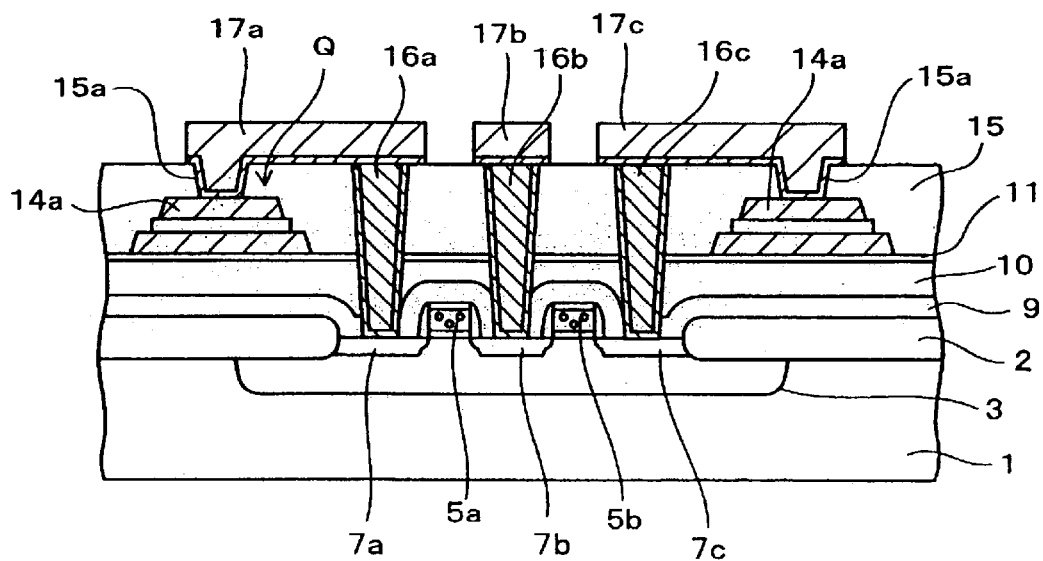
Figure 5H:
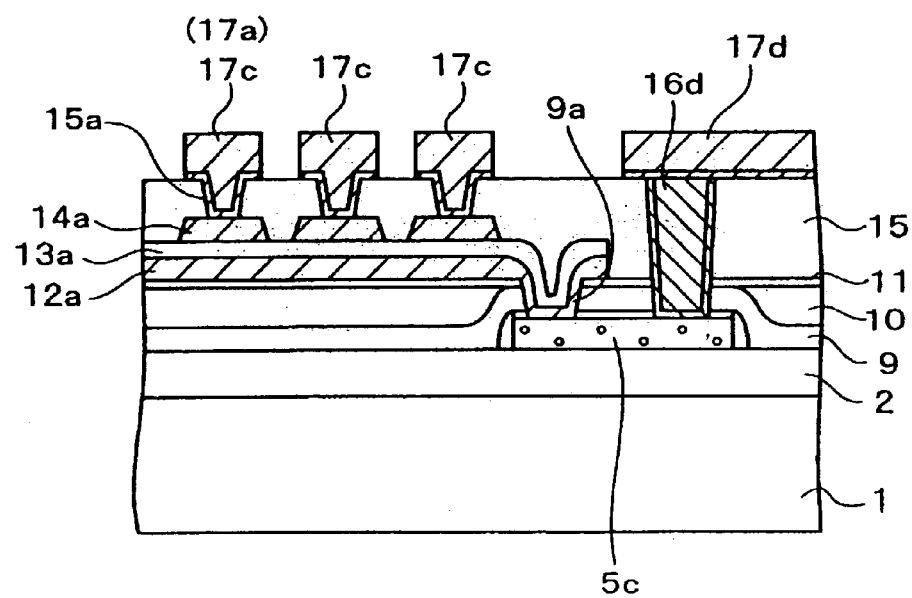

Next, steps required until a structure shown in FIG. 4H and FIG. 5H is formed will be explained hereunder.

First, a titanium nitride layer and an aluminum layer are formed sequentially on the second interlayer insulating layer 15 and the first to fourth conductive plugs 16a to 16d, and on inner surfaces of the upper electrode contact holes 15a by the sputter. The titanium nitride layer and the aluminum layer are formed on the second interlayer insulating layer 15 to have a thickness of about 50 nm and a thickness of about 500 nm respectively. In this case, in some case the copper is contained in the aluminum layer.

Then, the titanium nitride layer and the aluminum layer are patterned by the photolithography method. Thus, upper electrode wirings 17a, 17c, which pass through in the upper electrode contact holes 15a that are located closest to the first conductive plug 16a and the third conductive plug 16c respectively, are formed. At the same time, an island-like via contact pad 17b is formed on the conductive plug 16b in the middle of the p-well 3. Also, a lower electrode leading wiring 17d that is extended from the upper surface of the fourth conductive plug 16d on the element isolation insulating layer 2 onto the upper surface of the second interlayer insulating layer 15 is formed.

Accordingly, the lower electrode 12a of the capacitor Q is extended electrically to the upper surface of the second interlayer insulating layer 15 via the conductive pad 5c, the fourth conductive plug 16d, and the lower electrode leading wiring 17d and then is connected electrically to a peripheral circuit region (not shown). Also, the capacitor upper electrode 14a is connected electrically to the n-type impurity diffusion region 7a (7c) located near the end of the p-well 3 via the upper electrode wiring 17a (17c) and the conductive plug 16a (16c).

A planar configuration in the memory cell area in the situation that the upper electrode wirings 17a, 17c, the via contact pad 17b, and the lower electrode leading wiring 17d are formed, as described above, is shown in FIG. 14. In this case, other insulating layers of the element isolation insulating layer 2 are omitted in FIG. 6.

Also, FIG. 4H is a sectional view taken along a III—III line in FIG. 6, and FIG. 5H is a sectional view taken along a IV—IV line in FIG. 6.

Figure 4I:
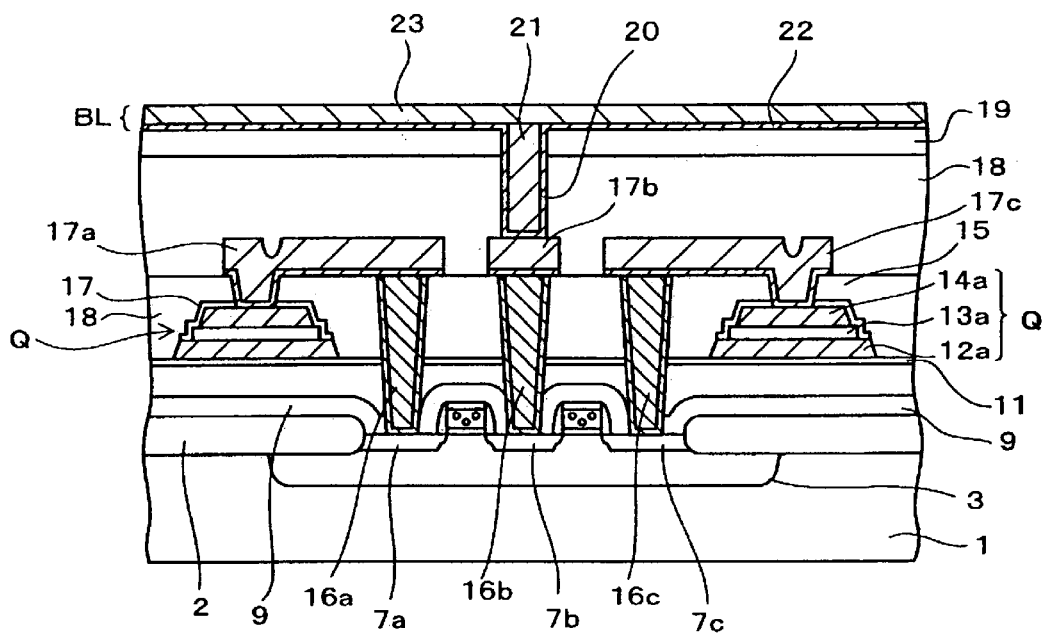
Figure 5I:
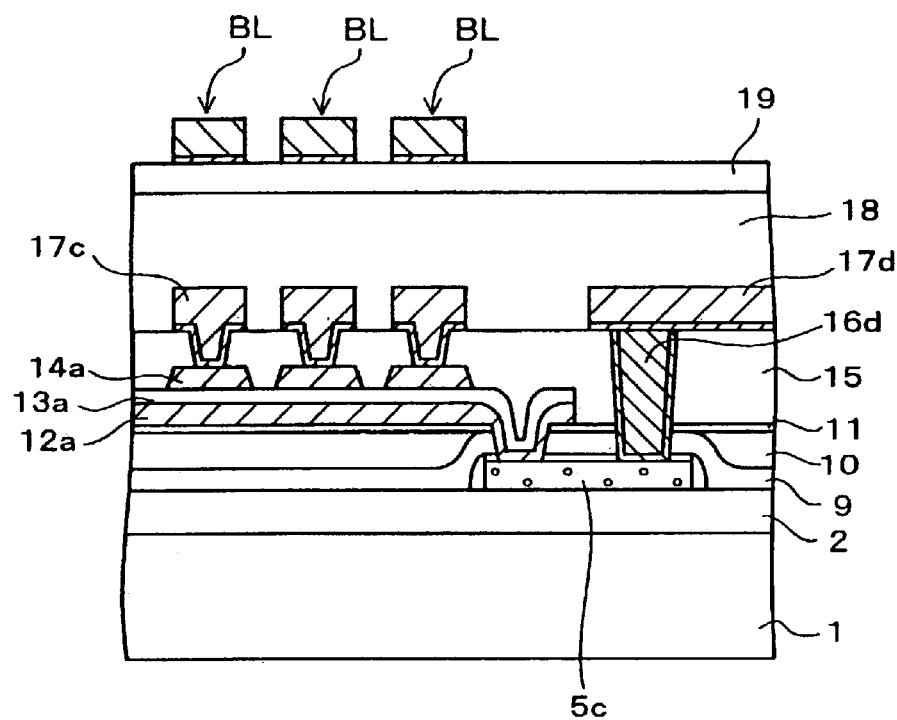

Next, steps required until a structure shown in FIG. 4I and FIG. 5I is formed will be explained hereunder.

First, a third interlayer insulating layer 18 of about 2300 nm thickness is formed on the second interlayer insulating layer 15, the upper electrode wirings 17a, 17c, the via contact pad 17b, and the lower electrode leading wiring 17d. As the third interlayer insulating layer 18, an $SiO_2$ layer is formed by the plasma CVD method using TEOS as a source, for example. Subsequently, a surface of the third interlayer insulating layer 18 is planarized by the CMP method.

Then, a protection insulating layer 19 made of $SiO_2$ is formed on the third interlayer insulating layer 18 by the plasma CVD method using TEOS. Then, a hole 20 is formed on the via contact pad 17b located over the middle of the p-well 3 in the memory cell area by patterning the third interlayer insulating layer 18 and the protection insulating layer 19.

Then, an adhesive layer 22 made of titanium nitride (TiN) having a thickness of 90 nm to 150 nm is formed on an upper surface of the protection insulating layer 19 and an inner surface of the hole 20 by the sputter method. Then, the substrate temperature is set to about 400° C. and a blanket tungsten layer is formed by the CVD method using $WF_6$ to bury the hole 20.

Then, the blanket tungsten layer is left only in the hole 20 by the etching-back. Thus, the blanket tungsten layer left in the hole 20 is used as a second-layer conductive plug 21.

Then, a metal layer 23 is formed on the adhesive layer 22 and the conductive plug 21 by the sputter method. Then, bit lines BL that are connected to the second-layer conductive plug 21 are formed by patterning the adhesive layer 22 and the metal layer 23 by means of the photolithography method. The bit line BL is connected electrically to the n-type impurity diffusion region 7b via the conductive plugs 21, 16b and the via contact pad 17b.

In the above embodiment, the element isolation insulating layer 2, the conductive pad 5c, the first interlayer insulating layer 10, the capacitor Q, the second interlayer insulating layer 15, and the lower electrode leading wiring 17d are formed sequentially over the silicon substrate 1.

Then, the lower electrode 12a of the capacitor Q and the fourth conductive plug 16d are connected separately to the upper surface of the conductive pad 5c via separate holes 9a, 10d, and the lower electrode leading wiring 17d is connected to the upper surface of the fourth conductive plug 16d.

Therefore, the necessity to connect the lower electrode leading wiring 17d to the upper surface of the lower electrode 12a via the contact hole can be eliminated to extend electrically the lower electrode 12a to the upper surface of the second interlayer insulating layer 15. Thus, there is no need to form the contact hole on the upper surface of the lower electrode 12a. Therefore, since the lower electrode 12a is not directly exposed to the reducing gas via the contact hole, such reducing gas can be prevented from being supplied to the ferroelectric layer 13 along the lower electrode 12a.

Then, the upper surface of the lower electrode 12a in the contact area can be covered with the dielectric layer 13a. As a result, since an almost overall area of the upper surface of the lower electrode 12a is covered with the dielectric layer 13a such as PZT, or the like that has also a protection function, deterioration of the dielectric layer 13a caused by a catalytic action of the lower electrode 12a can be suppressed in the steps executed after the capacitor Q is formed, and thus characteristics of the capacitor Q can be maintained good. The deterioration of the dielectric layer 13a is caused due to the reaction with the moisture contained in the interlayer insulating layers 15, 18 and the hydrogen.

Next, experimental results derived when the case where the lower electrode 12a is exposed from the dielectric layer 13a and the case where the lower electrode 12a is not exposed from the dielectric layer 13a are compared with each other will be explained hereunder.

Figure 7B:
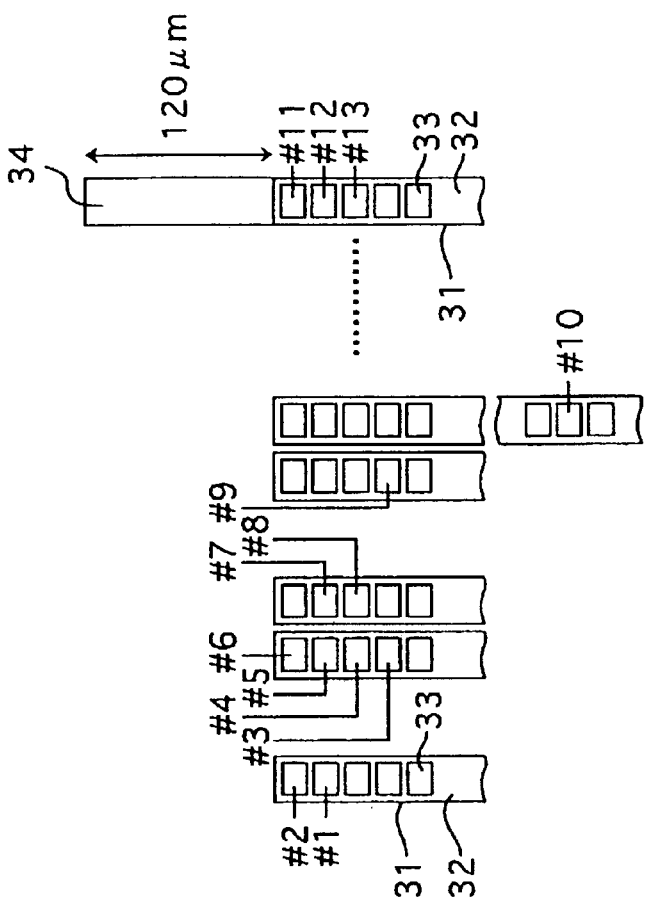
FIG. 7B is a plan view showing an arrangement of the capacitors formed in the lower electrodes shown in FIG. 7A.
Figure 7A:
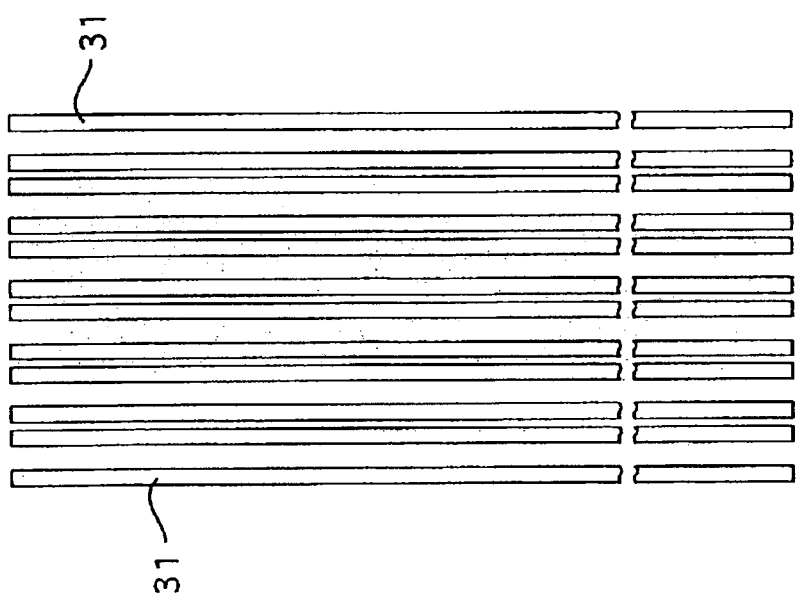
FIG. 7A is a plan view showing an arrangement of lower electrodes of capacitors.

FIG. 7A show such a configuration that a plurality of stripe-like lower electrodes 31 each having a width of about 2 μm are formed on the insulating layer at an interval. Also, FIG. 7B shows a part of such a configuration that ferroelectric layers 32 are formed on the lower electrodes 31 and also a number of upper electrodes 33 are formed on each ferroelectric layer 32 at a distance. One capacitor consists of one upper electrode 33, the underlying ferroelectric layer 32, and the lower electrode 32.

Also, an end portion of one lower electrode 31 has an extended area 34 that is protruded rather than the end portion of other lower electrode 31 by a length of 120 μm in the longitudinal direction and is exposed from the ferroelectric layer 32.

Figure 8:
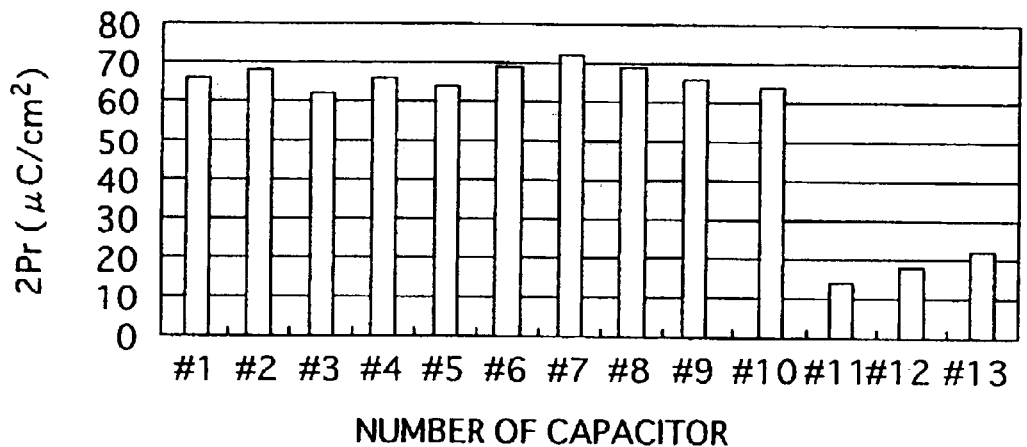
FIG. 8 is a view showing respective values of 2 Pr of a plurality of capacitors shown in FIG. 7B.

Then, when an amount of residual dielectric polarization charge (2 Pr) of the capacitors is sampled and measured, measured results shown in FIG. 8 are obtained.

Respective # numerals shown in FIG. 8 correspond to respective # numerals of the capacitors shown in FIG. 7B.

According to FIG. 8, 2 Pr of the #11, #12 and #13 capacitors that are close to the area, in which the lower electrode 31 is protruded from the ferroelectric layer 32 by a length of 120 μm, was smaller than remaining capacitors and its value was smaller than less than 30 $\mu C/cm^2$. Also, all the #1 to #9 capacitors that are close to the end portion of the lower electrode 31, all upper surface of which is covered with the ferroelectric layer 32, have the almost same 2 Pr magnitude as the #10 capacitor located in the center area of the lower electrode 31 and their 2 Pr value exceeds 60 $\mu C/cm^2$. Thus, their characteristics as the ferroelectric capacitor were good.

With the above, in the contact region of the stripe-like lower electrode of the capacitor, the characteristics of the ferroelectric capacitor can be improved if the structure the upper surface of which is covered with the ferroelectric layer and a wiring is extracted electrically from the lower surface is employed.

As described above, according to the present invention, the first insulating layer, the conductive pattern, the second insulating layer, the capacitors, the third insulating layer, and the lower electrode leading wiring are formed sequentially over the semiconductor substrate, then the lower electrode of the capacitor is connected to the upper surface of the conductive pattern, and then the lower electrode leading wiring is also connected electrically to the conductive pattern from its upper side.

Therefore, since such a necessity that the contact hole must be formed on the lower electrode can be eliminated, supply of the reducing gas to the lower electrode via the contact hole can be prevented. Thus, the characteristics of the capacitor having the lower electrode can be maintained good.

Also, since the overall upper surface of the lower electrode can be covered with the dielectric layer, the deterioration of the ferroelectric layer caused due to the catalytic action of platinum constituting the lower electrode can be suppressed in the steps executed after the capacitor is formed. Thus, the characteristics of the capacitor can be improved.

What is claimed is:

1. A semiconductor device comprising:
   a first insulating layer formed over a semiconductor substrate;
   active pattern formed over the first insulating lays;
   a second insulating layer for covering the conductive pattern;
   a first hole formed in the second insulating layer the conductive pattern;
   a lower electrode of a capacitor formed over the second insulating layer and having a contact area, a lower surface of which is connected electrically to the conductive pattern via the first hole;
   second insulating layer and having a contact area, a lower surface of which is connected electrically to the conductive pattern via the first hole;
   a dielectric layer of the capacitor formed on the lower electrode;
   an upper electrode of the capacitor formed on the dielectric layer in a region except the contact area;
   a third insulating layer formed over the upper electrode and the second insulating layer;
   a second hole formed in the third insulating layer and the second insulating layer over the conductive pattern at an interval from the first hole; and
   a lower electrode leading wiring formed over the third insulating layer to be connected electrically to the conductive pattern via the second hole.

2. A semiconductor device according to claim 1, wherein the dielectric layer is made of ferroelectric material.

3. A semiconductor device according to claim 1, wherein the dielectric layer is also formed on an upper surface of the contact area of the lower electrode.

4. A semiconductor device according to claim 3, wherein the dielectric layer is of ferroelectric material.

5. A semiconductor device according to claim 1, wherein the conductive pattern is formed of at least one of a silicon layer and a silicide layer.

6. A semiconductor device according to claim 1, wherein a word line having a same layer structure as the conductive pattern is formed over the semiconductor substrate.

7. A semiconductor device according to claim 1, wherein a lower surface of the lower electrode in the contact area is connected to the conductive pattern via the first hole.

8. A semiconductor device according to claim 1, wherein a conductive plug that is connected to the lower electrode leading wiring and the conductive pattern is formed in the second hole.

9. A semiconductor device according to claim 1, wherein the lower electrode is formed of at least any one of a noble metal and a noble metal oxide.

10. A semiconductor device according to claim 1, wherein the lower electrode and the dielectric layer are formed like a stripe, and the upper electrode is formed on the dielectric layer in plural at an interval.

11. A semiconductor device according to claim 1, further comprising:
    a third hole formed in the third insulating layer over the electrode; and
    an upper electrode leading wiring formed over the third insulating layer and connected electrically to the upper electrode via the third hole.

12. A manufacturing method of a semiconductor device comprising the steps of:
    forming a first insulating layer over a semiconductor substrate;
    forming a conductive layer over the first insulating layer;
    forming a conductive pattern by patterning the conductive layer;
    forming a second insulating layer over the conductive pattern and the first insulating layer;
    forming a first hole in the second insulating layer over the conductive pattern;
    forming lower electrode conductive layer in the first hole and over the second insulating layer;
    forming a dielectric layer on the lower electrode conductive layer;
    forming an upper electrode conductive layer on the dielectric layer;
    forming a capacitor upper electrode in a region that is away from the first hole by patterning the upper electrode conductive layer;
    forming a capacitor dielectric layer under at least the upper electrode by patterning the dielectric layer;
    forming a capacitor lower electrode, which is connected electrically to the conductive pattern, in an area containing a range that extends from a lower surface of the capacitor dielectric layer to an inside of the first hole by patterning the lower electrode conductive layer;
    forming a third insulating layer over the capacitor lower electrode, the capacitor dielectric layer, and the capacitor upper electrode, and the second insulating layer;
    forming a second hole in the third insulating layer and the second insulating layer over the conductive pattern at an interval from the first hole; and
    forming a lower electrode leading wiring, which is connected electrically to the conductive pattern via the second hole, over the third insulating layer.

13. A manufacturing method of a semiconductor device according to claim 12, wherein the capacitor dielectric layer is formed in a range that extends from a lower surface of the upper electrode to an end portion of the capacitor lower electrode.

14. A manufacturing method of a semiconductor device according to claim 12, further comprising the step of forming a conductive plug, which connect electrically the conductive pattern and the lower electrode leading wiring in the second hole before the lower electrode leading wiring is formed.

15. A manufacturing method of a semiconductor device according to claim 12, further comprising the step of forming a word line over the semiconductor substrate by patterning the conductive layer.

16. A manufacturing method of a semiconductor device according to claim 12, further comprising the steps of:
    forming a third hole over the capacitor upper electrode by patterning the third insulating layer; and
    forming an upper electrode leading electrode, which is extended from an inside of the third hole, over the third insulating layer.

* * * * *